United States Patent [19]

Sheng et al.

[11] 3,950,657
[45] Apr. 13, 1976

[54] TIMER CIRCUITS
[75] Inventors: Abel Ching Nam Sheng, Morris Plains; Merle Vincent Hoover, Flemington, both of N.J.
[73] Assignee: RCA Corporation, New York, N.Y.
[22] Filed: Oct. 21, 1974
[21] Appl. No.: 516,588

[52] U.S. Cl. ... 307/252 UA; 307/252 B; 307/252 N; 307/293
[51] Int. Cl.² .......................................... H03K 17/00
[58] Field of Search ..... 307/252 UA, 252 B, 252 N, 307/293, 273, 265; 323/25; 317/141 S

[56] References Cited
UNITED STATES PATENTS

| | | |
|---|---|---|
| 3,452,214 | 6/1969 | Martin.................... 307/252 UA UX |
| 3,691,404 | 9/1972 | Swygert, Jr. .................. 307/252 UA |
| 3,735,241 | 5/1973 | O'Sullivan..................... 307/252 UA |
| 3,764,890 | 10/1973 | Caen............................ 307/252 UA |

Primary Examiner—Stanley D. Miller, Jr.
Assistant Examiner—B. P. Davis
Attorney, Agent, or Firm—H. Christoffersen; S. Cohen; R. G. Coalter

[57] ABSTRACT

Clock pulses for a counter and trigger pulses for a thyristor switch are derived from the axis crossings of an alternating current signal. Logic circuits responsive to the counter determine the total number of trigger pulses supplied to the thyristor subsequent to a control signal transition or, in the alternative, delay application of the trigger pulses until a given number of axis crossings have occurred.

10 Claims, 5 Drawing Figures

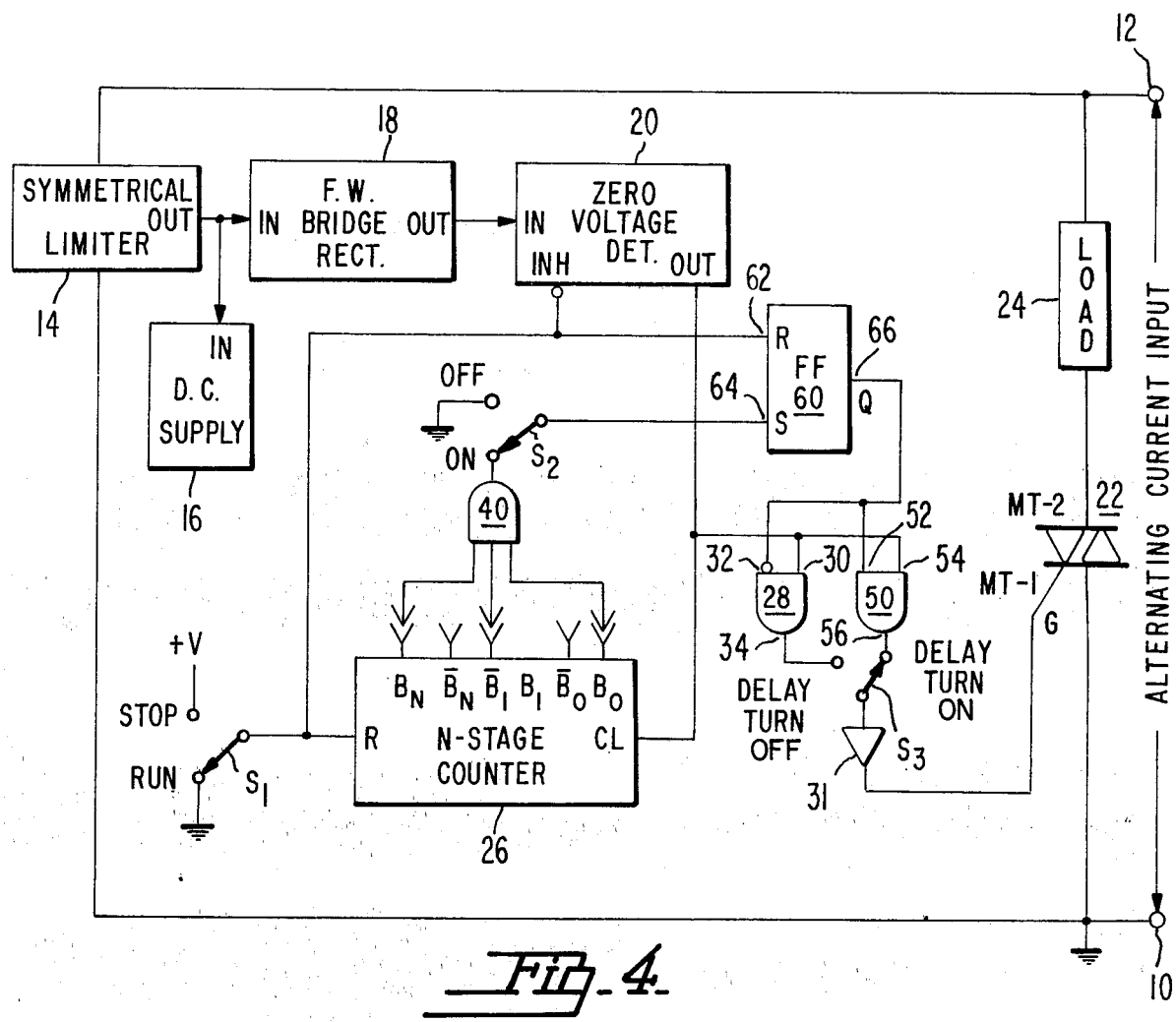
_Fig. 4_
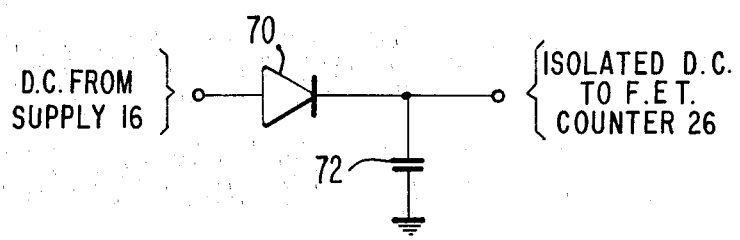
_Fig. 5_

TIMER CIRCUITS

This invention relates to electrical timer circuits and particularly to electrical timer circuits for switching alternating current signals.

Where precision long-period timing is required in an AC power control system it is customary to employ synchronous motor driven switches. The accuracy of such systems is quite good but is attendent with the usual disadvantages of mechanical systems. In short-period timing applications or where less accuracy is required it is customary to employ all-electronic circuits in which the timing period is based, for example, on the charging rate of a capacitor. In either approach, objectional radio frequency interference is generated at the moment of switching since the phase accuracy of even the synchronous motor driven timer is inadequate to assure synchronous switch closure at zero crossings of the alternating current signal.

Further disadvantages of known timing circuits include their inability to be a rapidly reset to restart a new timing sequence, the difficulty (especially with mechanical systems) of reprogramming their timing cycle and their sensitivity to line voltage variations. This latter factor is particularly important under "brown-out" conditions where the line voltage may drop to a value substantially less than its normal value.

A need exists for an easily programmable multimode timer for providing zero voltage switching of alternating current signals. A need also exists for a timer capable of being immediately retriggered at the end of a timing sequence and that is relatively insensitive to line voltage variations. A further need exists for an alternating current line operated timer requiring no precision components but achieving an accuracy as good as the time base provided by the AC power line. The present invention is directed to meeting these needs.

In timer circuits embodying the present invention clock pulses for a counter and trigger pulses for an electronic switch are derived from the axis crossings of an alternating current signal. A first circuit initially in a first state and responsive to advancement of the count to a given value changes to a second state. A second circuit applies the trigger pulses to the switch during the interval that the first circuit is in a selected one of its states.

The invention is illustrated in the accompanying drawings wherein like reference numerals designate like elements and in which:

FIGS. 1, 2 and 4 are block diagrams illustrating embodiments of the invention;

FIG. 5 is a circuit diagram illustrating a modification of FIGS. 1, 2 and 4.

Figure 1:
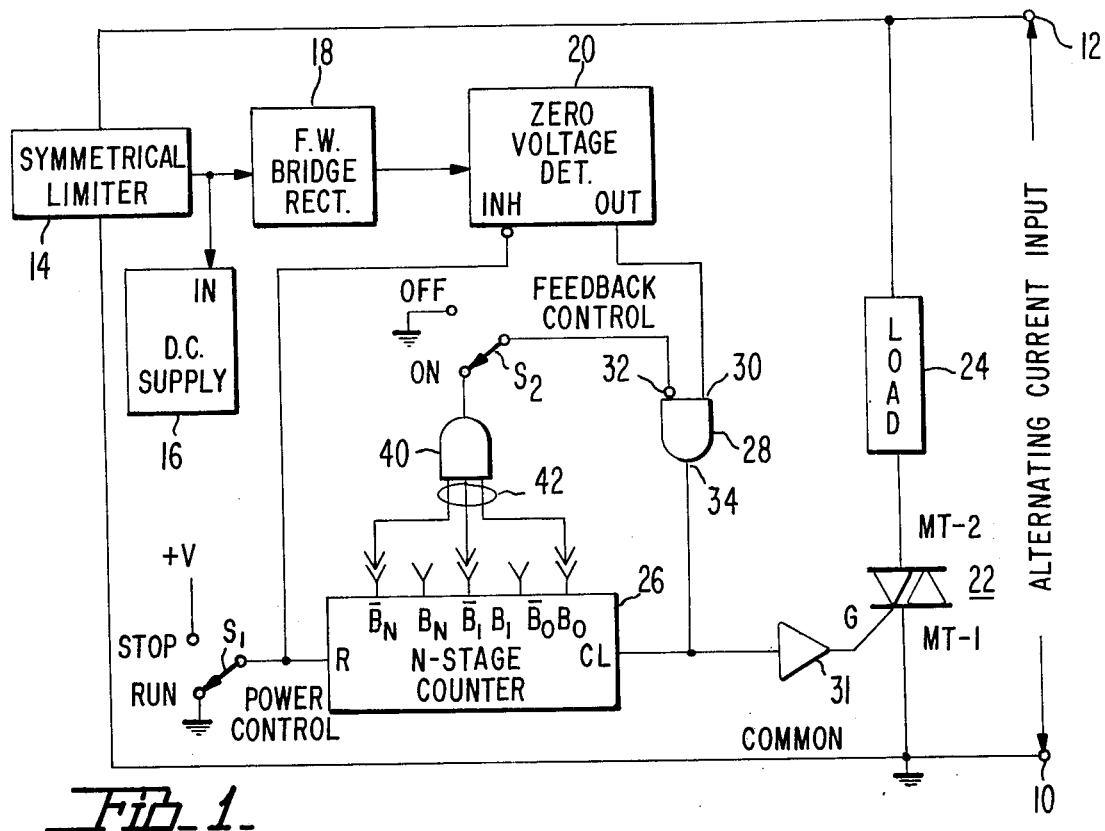

In FIG. 1, terminals 10 and 12 receive an alternating current input signal which is preferably obtained from a commercial power line but may be obtained from other suitable sources such as shipboard alternators or the like. Commercial power is preferred because its frequency is generally controlled with great accuracy and this signal is employed as the timer time-base reference. The use of commercial power as a time base reference eliminates the need for precision components (crystal oscillators, etc.) in most timing applications.

Symmetrical limiter 14, which receives the AC input signal, produces a relatively low voltage alternating polarity output signal having a given peak amplitude which is relatively insensitive to amplitude variations of the AC input signal. This contributes greatly to the overall circuit insensitivity to power line voltage variations since, as will be seen, the circuit operating voltages and timing signals are derived from the limiter output signal. The limiter may comprise a current limiting resistor connected in series with a pair of oppositely poled Zener diodes as is well known in the art.

Figure 3:
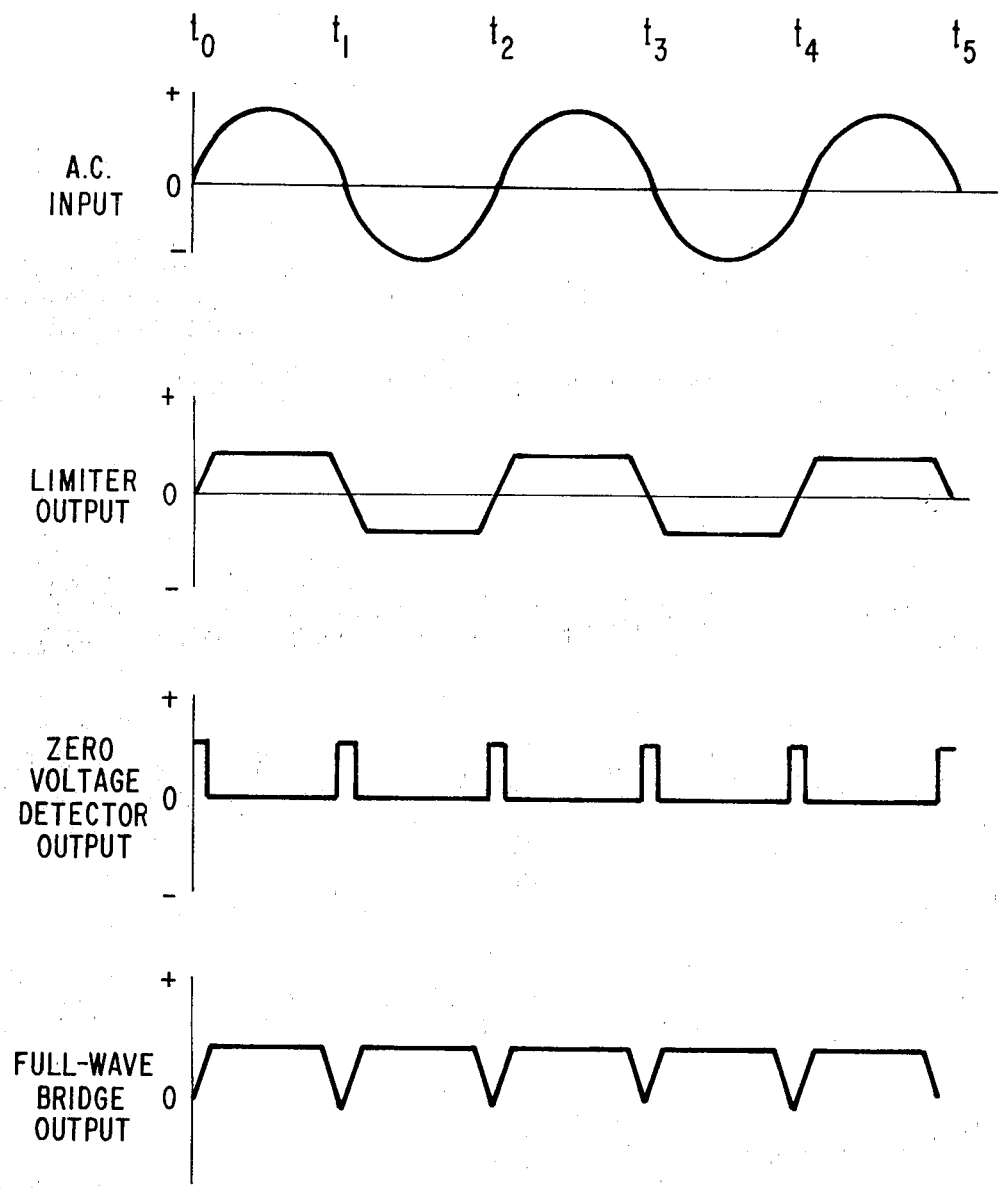
FIG. 3 illustrates waveforms associated with the diagrams of FIGS. 1, 2 and 4.

The stabilized low voltage alternating polarity signal produced by limiter 14 is utilized for two purposes. It is applied to direct current supply 16 where it is rectified and filtered for supplying direct current operating potentials to the remaining circuit elements. It is also applied to full-wave bridge rectifier 18 for producing a unipolarity pulsating signal of zero amplitude at each axis crossing of the AC signal and a limited amplitude otherwise. The AC signal, limiter output signal and bridge output signal are each illustrated in FIG. 3.

Zero voltage detector 20 converts the signals produced by rectifier 18 to unipolarity output pulses occurring substantially at the zero crossings of the AC input signal. Production of the pulses is inhibited upon receipt of a relatively positive control signal applied to the detector inhibit input terminal and is enabled when the control signal is at ground level.

The detector 20 output pulses perform two functions. Firstly, they are employed as trigger signals for causing zero voltage switching of thyristor 22 (preferably a triac), the main terminals MT-1, MT-2 of which are connected in series with load 24 across AC terminals 10 and 12. This results in the important advantages of zero voltage switching, such as reduced radio frequency interference and minimized load surge currents. Secondly, the output pulses are employed as clock signals for N-stage binary counter 26. As previously mentioned, this results in the important advantages of elimination of the need for oscillators or other timing signal sources and requires no precision components. Timing accuracy, nevertheless, is quite high being limited only by the time base accuracy of the AC input signal, which, as discussed is very accurate indeed for most purposes.

Turning now to the remaining circuit elements in FIG. 1, AND gate 28 receives the pulses produced by detector 20 at its first input terminal 30 and an inhibit input signal at its inhibit input terminal 32. This gate produces output pulses at its output terminal 34 only when the inhibit input signal is at ground level. Gate 28 performs two functions in the timer of FIG. 1. First, it serves to couple the output pulses produced by detector 20 to the CLOCK terminal of counter 26 and gate terminal G of thyristor 22. Second, it forms a portion of the counter feedback path (to be described) which both stops the counter and prevents further trigger pulses from being supplied to the thyristor when a given count is reached.

Buffer 31, coupled between output terminal 34 of AND gate 28 and gate terminal G of thyristor 22, provides increased gate drive capability to the thyristor if such is needed. This buffer may be omitted where such increased gate drive is not required.

N-stage counter 26 is reset by a positive logic signal applied to its RESET terminal which, preferably, overrides the effect of any clock pulses supplied to its clock terminal. The counter preferably includes a plurality of true output terminals $B_o$, $B_l$, $B_N$, and may also include complementary output terminals $\bar{B}_o$, $\bar{B}_l$, $\bar{B}_N$. The complementary output terminals may, of course, be eliminated in a given application since complementary signals are easily generated from the true signals. In applications not requiring program flexibility, all output terminals (both true and complementary) but one may be eliminated. The timing would then be limited to a factor related to $2^N$ times the clock period.

Power control switch $S_1$ is operable in the RUN position (illustrated) to apply a ground level signal to the RESET terminal of counter 26 and to the inhibit terminal of detector 20. This primes counter 26 to count pulses supplied to its clock terminal and enables detector 20 to produce output pulses. In the STOP position of switch $S_1$, counter 26 is reset and detector 20 inhibited. Switch $S_1$ thus is seen to provide a control signal of one value for initiating a timing operation and of another value for directly terminating the timing operation.

AND gate 40, which is coupled at its input terminals 42 to selected ones of the output terminals of counter 26, produces a positive output signal when the count in the counter equals a given value, gate 40, in combination with counter 26, provides the programmability feature of the present invention by which the time period may be easily changed by manually changing its connections to the counter output terminals (thumbwheel switches may be provided for this purpose). In the alternative, gate 40 may comprise a more complex logic structure programmable by electrical input signals. For example, gate 40 may be replaced by one or more AND/OR SELECT gates, each AND gate being programmed for a different preset time period and primed by an appropriate externally supplied SELECT signal. Of course, where programmability is not required, gate 40 may be eliminated as previously mentioned.

When in the OFF position, feedback control switch $S_2$ applies a ground level logic signal to the inhibit input terminal 32 of gate 28. This primes gate 28. When ON, this switch applies the output signals produced by AND gate 40 to the inhibit terminal of gate 28. If this signal is high (positive) gate 28 is inhibited and if low (ground level) gate 28 is primed.

In the following discussion of the overall operation, assume that power control switch S-1 initially is in the STOP position and that feedback control switch $S_2$ is in the OFF position. Symmetrical limiter 14 and full wave bridge rectifier 18, operate as previously described, to supply signals to zero voltage detector 20 representative of zero crossings of the alternating current signal applied to terminals 10 and 12. Since under the given assumptions a positive potential is applied to the inhibit input terminal of detector 20, no output pulses are produced, thyristor 22 is not triggered and no load current flows through load 24.

Placing power control switch $S_1$ in the RUN position applies a ground level signal to the inhibit input terminal of detector 20 causing the detector to produce unipolarity output pulses substantially at the zero voltage crossings of the AC input signal. Since the inhibit input terminal 32 of gate 28 is maintained at ground potential by feedback control switch $S_2$, gate 28 supplies the output pulses produced by the detector to the gate terminal G of thyristor 22 via non-inverting buffer amplifier 30. Since these pulses occur at the zero crossings of the AC signal, thyristor 22 is triggered into conduction at each zero crossing thereby providing the well known advantages of zero voltage switching of the load current through load 24.

It is thus seen that when feedback control switch $S_2$ is OFF, the circuit of FIG. 1 operates in a direct control mode (non-timed) in accordance with the position of switch $S_1$ (STOP, RUN) for providing zero voltage switching of the load current.

A delayed turn-off operating mode is achieved when switch $S_2$ is in the ON position. The term "delayed turn-off", as used herein, refers to an operating mode in which the thyristor is triggered at the start of and throughout the timing cycle and thereafter is maintained in its off condition. "Delayed turn-on" refers to an operating mode (discussed with regard to FIG. 2) in which the thyristor is not triggered prior to or during the timing cycle and is triggered at the end of the timing cycle.

With switch $S_2$ in the ON position and switch $S_1$ in the STOP position, detector 20 is inhibited and counter 26 is reset. The reset counter disables gate 40 thereby priming gate 28. However, detector 20 is inhibited so that no trigger pulses are applied via gate 28 to the thyristor.

When switch $S_1$ is changed to the RUN position, detector 20 is enabled to produce output pulses which, passed by gate 28, trigger thyristor 20 and advance counter 26. When the count in counter 26 equals the number for which AND gate 40 is programmed, AND gate 40 applies a high inhibit signal to gate 28. This disables gate 28 and prevents further clock pulses from reaching counter 26. This prevents the count stored in the counter 26 from advancing any further. Gate 28 therefore remains inhibited by the gate 40 output signal for so long as switch $S_1$ thereafter remains in the RUN position.

Since the thyristor trigger pulses correspond to the clock pulses in this embodiment of the invention, it is apparent that the length of time that the thyristor is conductive is determined by the period of the AC input signal and the programming of gate 40. The basic time period may thus be easily changed as previously noted by reprogramming gate 40. In addition to the ease of programmability, the high accuracy obtained from the line frequency time base, and the lack of any precision timing components, the feature of zero voltage switching is also obtained in the delayed turn-off mode.

Figure 2:
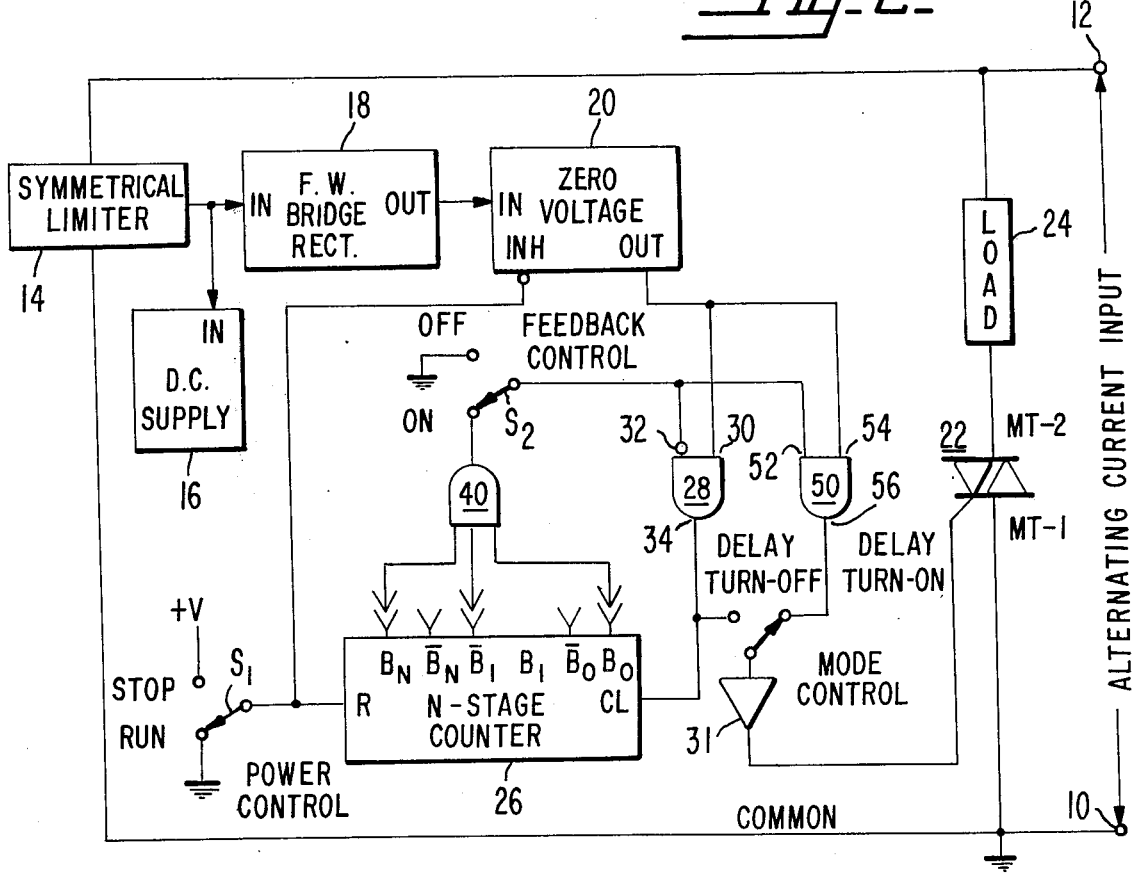

FIG. 2 illustrates a modification of the timer of FIG. 1 for providing the additional operating mode of "delayed turn-on" mentioned previously. This further mode is provided by the addition of AND gate 50 and a two position switch $S_3$. Input terminals 52 and 54 of AND gate 50 are connected to terminals 32 and 30, respectively, of AND gate 28. Mode control switch $S_3$, in its delay turn-on position connects output terminal 56 of AND gate 50 to the input of buffer 31. In its delay turn-off position, switch $S_3$ connects output terminal 34 of AND gate 28 to the input of buffer 31.

Operation of the timer of FIG. 2 is identical to that previously discussed with regard to the timer of FIG. 1 when mode control switch $S_3$ is in the delayed turn-off position. Placing switch $S_3$ in the delay turn-on position, however, provides the delayed switching action mentioned previously in the discussion of FIG. 1.

In more detail, assume that switch $S_1$ is in the STOP position, switch $S_2$ is in the ON position and switch $S_3$ is in the delay turn-on position. Under these circumstances counter 26 is reset, gate 40 is disabled, gate 28 is primed, gate 50 is inhibited and detector 20 is inhibited so that thyristor 22 receives no trigger pulses and thus no load current flows through load 24.

When switch $S_1$ is changed to the RUN position, detector 20 begins producing pulses which, passed by primed gate 28, advance counter 26. Eventually the count will equal the value for which AND gate 40 is programmed at which time gate 40 applies an inhibit signal to AND gate 28 and a priming signal to AND gate 50. Inhibited gate 28 operates as previously described to stop counter 26. Primed gate 50 then begins to apply the pulses produced by detector 20 to buffer 31 for triggering thyristor 22. This condition continues until switch $S_1$ is returned to its STOP position.

FIG. 4 illustrates a modification of the timer of FIG. 2 in which the feedback path for counter 26 has been eliminated. Here, clock pulses are applied directly to the clock input terminal of counter 26 from the output terminal of detector 20. Terminals 32 and 52 of AND gates 28 and 50, respectively, which were formerly directly connected to switch $S_2$ are here connected to the Q output terminal 66 of flip flop 60. The flip-flop SET and RESET input terminals 64 and 66, respectively, receive the signals produced by switches $S_2$ and $S_1$, respectively.

Operation of the timer of FIG. 4 is substantially the same as that of FIG. 2 except that since the feedback path has been eliminated, counter 26 advances continuously in response to the pulses produced by detector 20. The function of controlling AND gates 28 and 50, previously provided by the counter feedback signal is now performed by flip-flop 60. This flip flop is initially RESET when counter 26 is RESET and detector 20 is inhibited so that gate 50 is inhibited and gate 28 is primed. If switch $S_3$ is in the delay turn-off position when the timing cycle begins, primed gate 28 will apply the pulses produced by detector 20 to thyristor 22 causing a load current to flow through load 24. This action will continue until the count equals the value for which AND gate 40 is programmed at which time flip-flop 60 is SET. Gate 28 is then inhibited so that no further pulses are applied to thyristor 22 and the load current flow will cease. In this case, unlike that of FIG. 2, counter 26 will continue to advance until reset by switch $S_1$ but this continuous counter operation has no effect on circuit operation after flip flop 60 has been SET.

If, on the other hand, switch $S_2$ is in the delay turn-on position at the beginning of a timing cycle, thyristor 22 will not receive trigger pulses until flip flop 60 is SET. This occurs when the count reaches the value for which gate 40 is programmed, at which time gate 50 is primed to supply trigger pulses via buffer 31 to the thyristor. Thus, the thyristor is triggered on after a given number of axis crossings have occurred subsequent to a control signal transition (provided by switch $S_1$) and remains on thereafter until the counter and flip flop are reset.

In each of the examples given, placing switch $S_1$ in the STOP position resets the counter immediately. Thus, in any operating mode the timer circuits of the present invention are capable of being immediately restarted (retriggered) without regard to whether or not a given timing cycle has been completed.

Numerous changes and modifications may be made in the timing circuits of the present invention to suit specific circuit applications. For example, where the desired time period happens to correspond to a binary count that is a multiple of $2^n$ times the detector 20 pulse period, decoding gate 40 may be eliminated and the corresponding $B_n$ output terminal of counter 26 connected to the ON terminal of switch $S_2$. Switch $S_1$ may be eliminated and replaced by a terminal for receiving externally supplied control signals or by a "power-up detector" (not shown) of the kind producing a momentary output pulse upon initial application of the AC input signal. Switch $S_2$ may be eliminated if the direct control mode feature is not desired.

The specific details of symmetrical limiter 14, direct current supply 16, full-wave bridge rectifier 18, zero voltage detector 20, AND gate 28, and buffer 30 are presented in Application Note ICAN-6182 which was published in October, 1973, by RCA Corporation. The aforementioned circuit elements are commercially available in integrated circuit form in, for example, the CA3058 and CA3059 Zero Voltage Switches manufactured by RCA Corporation.

In each of the embodiments D.C. supply 16 performs the functions of rectifying and filtering the limiter 14 output signal to obtain direct current operating potentials for the remaining circuit elements. In its most elementary form supply 16 may comprise a diode connected to half wave rectify the limiter output signal and a capacitor for smoothing the half wave rectified signal thus producing stabilized D.C. operating potentials. In the event of a power failure the energy stored in the capacitor will temporarily maintain the count stored in counter 26 at its previous stored value. An increased storage time may be obtained by increasing the value of the capacitor in supply 16.

On the other hand, where a substantial storage time is required (minutes or hours) the required capacitor size for supply 16 may become impractical. In such a case it is preferred that counter 26 be implemented with complementary field-effect transistor (FET) technology and supplied with power from a capacitor isolated from power supply 16 by a diode. Complementary FET counters are known which consume exceedingly low amounts of standby power therefore a relatively small capacitor can be adequate to maintain the stored count for appreciable lengths of time. Diode isolation is necessary to prevent discharge of the energy stored in the counter's storage capacitor through the remainder of the timer circuit. This aspect of the invention is illustrated in FIG. 5 in which isolation diode 70 receives direct current from supply 16. The diode is poled to normally conduct current to FET counter 26 and to charge counter storage capacitor 72. When power fails and the potential of supply 16 decreases, diode 70 isolates capacitor 72. This capacitor then supplies the necessary standby power for FET counter 24 during the power outage.

It will be appreciated that although AND gates have been shown to perform the decoding function in the specific examples of FIGS. 1, 2 and 4, that other suitable logic gate decoders may be employed instead (such as single or multiple NAND or NOR gates or other combinations of logic elements). Also, other suitable thyristors or switches may be substituted for triac 22 in a given application. For example, triac 22 may be replaced by a reverse blocking triode thyristor such as a semiconductor controlled rectifier (SCR), a hot cathode gaseous device such as a thyratron, or a mercury pool device such as an ignitron. The output characteristics of buffer 31 may be selected to provide the trigger drive signal required for the particular thyristor or switch employed. The buffer may, of course, be eliminated in applications where the logic gate output signal is in itself adequate to trigger the output switching device selected.

What is claimed is:

1. In a switching circuit of the kind employing a thyristor switch and means for producing trigger pulses at zero crossings of an alternating current signal to be switched, the improvement comprising, in combination:
   a counter having an initial count stored therein;
   means for deriving clock pulses from said trigger pulses for advancing the counter;
   circuit means initially in a first state and responsive to advancement of the count to a given value for changing to a second state; and
   logic gate means receptive of said trigger pulses and responsive to a selected state of said circuit means for applying said trigger pulses to said thyristor during the interval said circuit means is in said selected state.

2. The combination recited in claim 1 further comprising:
   initializing means responsive to a control signal for concurrently setting said counter to said initial count, for returning said circuit means to said first state and for preventing application of said trigger pulses to said thyristor.

3. The combination recited in claim 1 wherein said circuit means comprises:
   a programmable decoding gate receptive of selected ones of a plurality of logic output signals produced by said counter, said decoding gate being disabled when the count in said counter differs from a programmed value and being enabled when the count equals the programmed value.

4. The combination recited in claim 2 wherein said circuit means comprises:
   binary storage means coupled to said counter and to said initializing means for receiving set and reset input signals, respectively, and coupled to said logic gate means for supplying an output signal thereto of one value when set and of another value when reset.

5. The combination recited in claim 1 wherein:
   said counter includes a RESET input terminal, receptive of a first control signal, a CLOCK input terminal receptive of a clock input signal, and a plurality of output terminals producing output signals representative of the count stored therein;
   said circuit means comprises a multiple input logic gate having its input terminals connected to selected ones of the counter output terminals;
   said logic gate means comprises a two input gate connected at its output terminal to the gate electrode of said thyristor switch, said two input gate receiving said trigger pulses at one of its input terminals and connected at its other input terminal to the output terminal of said multiple input logic gate; and wherein
   said means deriving clock pulses for said counter comprises means coupling said CLOCK input terminal to said output terminal of said two input logic gate.

6. A timer circuit, comprising:
   two terminals for receiving an alternating current input signal;
   zero voltage detector means coupled to said two terminals for producing trigger pulses substantially at the axis crossings of said alternating current signal;
   a counter having an initial count stored therein and responsive to clock pulses for advancing the count, said clock pulses being derived from said trigger pulses;
   logic means coupled to said counter and initially in a first state, said logic means being responsive to the advancement of the count to a given value for changing to a second state;
   a triggerable electronic switch for connection in series with a load across said two terminals, said switch having a gate terminal for receiving said trigger pulses; and
   circuit means responsive to said trigger pulses and the state of said logic means for applying said trigger pulses to said gate terminal during the interval that said logic means is in a selected one of its states.

7. The timer circuit recited in claim 6 further comprising:
   initializing means responsive to a control signal for setting said counter to said initial count, for placing said logic means in said first state and for preventing application of said trigger pulses to said gate terminal.

8. The timer circuit recited in claim 7 wherein said triggerable electronic switch is selected from the group comprising thyristors, thyratrons and ignitrons.

9. The timer circuit recited in claim 6 wherein said logic means comprises:
   a programmable logic gate receptive of selected ones of a plurality of logic output signals produced by said counter, said programmable logic gate being disabled when the count in said counter differs from a programmed value and being enabled when the count equals the programmed value.

10. The timer circuit recited in claim 7 wherein said logic means comprises:
    binary storage means coupled to said counter and to said initializing means for receiving SET and RESET input signals, therefrom, respectively, and coupled to said circuit means for supplying an output signal thereto of one value when SET and of another value when RESET.

* * * * *